United States Patent [19]

Walter

[11] Patent Number: 5,777,465

[45] Date of Patent: Jul. 7, 1998

[54] CIRCUITRY AND METHOD FOR SENSING SPATIAL TRANSITIONS SENSED WITH A MAGNETIC SENSOR

[75] Inventor: William Walter, Nashua, N.H.

[73] Assignee: Analog Devices, Inc., Norwood, Mass.

[21] Appl. No.: 601,304

[22] Filed: Feb. 16, 1996

[51] Int. Cl.[6] ............... G01P 3/42; G01P 3/488; G01B 7/30; H03K 5/1532

[52] U.S. Cl. .................. 324/166; 123/146.5 A; 324/174; 324/207.12; 324/207.2; 324/103 P; 327/62

[58] Field of Search ............ 324/163–166, 324/173, 174, 207.12, 207.2, 207.21, 207.24, 207.25, 251, 103 P; 123/146.5 A, 414, 617; 327/58, 62, 510, 511, 516; 188/181 R; 303/138; 340/670, 671; 361/236, 239; 364/565

[56] References Cited

U.S. PATENT DOCUMENTS

| | | | |
|---|---|---|---|
| 4,223,682 | 9/1980 | Sherman | 324/103 P X |
| 4,293,814 | 10/1981 | Boyer | 324/207.2 X |
| 4,311,960 | 1/1982 | Barr | 324/103 P |
| 4,737,710 | 4/1988 | Van Antwerp et al. | 324/207.2 |
| 4,914,387 | 4/1990 | Santos | 324/166 |
| 4,970,463 | 11/1990 | Wolf et al. | 324/207 |
| 5,144,231 | 9/1992 | Tenenbaum et al. | 324/164 |
| 5,334,930 | 8/1994 | Onodera et al. | 324/103 P |
| 5,442,283 | 8/1995 | Vig et al. | 324/174 X |
| 5,446,375 | 8/1995 | Perkins | 324/173 X |

FOREIGN PATENT DOCUMENTS

95/16896  6/1995  WIPO.

OTHER PUBLICATIONS

Allegro Microsystems, Inc. "3046, 3056, and 3058: Hall Effect Gear–Tooth Sensors–Zero Speed" (date unknown).

Primary Examiner—Gerard R. Strecker
Attorney, Agent, or Firm—Hale and Dorr LLP

[57] ABSTRACT

A circuit for use with a magnetic sensing device having at least first and second sensors has a summing amplifier for providing a difference signal and a peak detector for detecting peaks in the difference signal. The peaks determine a spatial offset of a transition in a sensed body.

21 Claims, 14 Drawing Sheets

CIRCUITRY AND METHOD FOR SENSING SPATIAL TRANSITIONS SENSED WITH A MAGNETIC SENSOR

FIELD OF THE INVENTION

This invention relates to circuitry for use with magnetic sensors.

BACKGROUND OF THE INVENTION

According to the well-known Hall effect, if a magnetic field is applied along a z-axis to a bar that carries a current along an x-axis, an electric field is produced along a y-axis. If the current density is known, the electric field can be sensed to determine the magnitude of the magnetic field, or at least to sense a change in the magnetic field.

A Hall cell is a sensing device that takes advantage of the Hall effect by providing a current along a bar and using output leads to provide a signal indicative of an electric field transverse to the bar. This signal thus senses a magnetic field mutually orthogonal to the current and electric field. One or more such Hall cells can be provided onto an integrated circuit (IC), along with other circuitry for processing the signals from the cells.

A magnetic field between a permanent magnet and a ferrous body varies depending on a distance between the magnet and the body. So if a magnetic field sensor is positioned between the magnet and the body, it can sense changes in distance or position of the body relative to the magnet. This concept is used to produce sensors known as gear-tooth sensors which sense the passing of teeth or notches in a rotating body when the circumference of the body moves past the sensor. If the body is a cam shaft or a crank shaft of an automobile, the sensor can sense for ignition timing, fuel injection, or engine speed. This application of such a sensor is generally shown, for example, in Wolf, U.S. Pat. No. 4,970,463.

A simple approach for sensing positional change in a body is to use a single Hall cell to provide a signal to a comparator for detecting when the magnitude of the signal crosses a threshold. By using such a fixed threshold, however, if other factors affect the magnitude of the signal, these factors also affect when the signal exceeds the threshold and thus the accuracy of the sensor. For example, if the body moves closer to or further away from the sensor along an axis transverse to the sensing axis, such movement non-linearly affects the strength of the magnetic field, and hence the magnitude of the output signal. In a theoretical worst case, if the threshold is high relative to the maximum field and if the sensed body moves sufficiently far from the sensor, the signal could be too weak to trip the threshold, and thus the appearance of a tooth or notch could be missed. But if the threshold is low relative to the maximum field, a faster transition at an edge between a tooth and a notch can affect where the sensor indicates that the edge is.

In WO95/16896, a prior sensor is described in which a signal from a single Hall cell is differentiated, and the differentiated signal is used to control a gating circuit based on a peak of the differentiated signal. Because the amplitude of the differentiated signal is a function of the frequency of the signal, i.e., $d(A*\sin(wt))/dt = Aw*\cos(wt)$, the dynamic range of the sensor must be able to discriminate a much wider range in the amplitude of the differentiated output signal. Moreover, differentiation circuitry inherently introduces noise into the signal. This combination of a wider output range and additional noise creates problems with sensitivity and accuracy.

Another approach is utilized in several devices available from Allegro Microsystems, Inc. of Worcester, Mass. In these models, signals from two Hall cells are provided to a differential amplifier that produces a signal indicating a difference in the magnetic field sensed by the two cells. The amplified signal is provided to a Schmitt trigger which serves as a thresholding device, with thresholds based on the hysteresis of the Schmitt trigger. Compared to the dynamic range of the difference signal, given as about ±150 Gauss, the thresholds are relatively low, i.e., about ±25 Gauss. Consequently, if the bar moves relative to the sensor along an axis transverse to a sensing axis, the difference signal can increase more quickly or more slowly. As a result, the spatial distance between the threshold crossing and the edge of the tooth or notch can vary depending on the position of the body along that transverse axis. This variation can reduce the accuracy of the timing.

Accordingly, it would be desirable to have an accurate and reliable method and apparatus for sensing with a magnetic sensor when a transition, such as that between a tooth and a notch, occurs in a sensed body, without (1) introducing noise or increasing the required dynamic range, or (2) being sensitive to external factors such as movement by the sensed body in a direction transverse to a sensing axis.

SUMMARY OF THE INVENTION

It has been found that when a difference signal is derived from two Hall cells, the spatial distance between a certain threshold magnitude of that signal and an edge of a toothed body can vary depending on variations in a distance between the sensor and the body. By contrast, it has been found that peaks of this difference signal have a significantly more consistent and reliable spatial offset with respect to an edge of a particular body.

According to the present invention, sensing of transitions in a body is performed with at least first and second sensors that sense a magnetic field and provide signals indicative of the magnetic field to a summer that subtracts the signals from the first and second sensors to produce a difference signal. A peak detect block detects peaks in the difference signal and provides an output signal that indicates a location of a transition, such as an edge, of a sensed body. The location of the edge is offset from the peak by a spatial amount that is generally consistent for a given body.

In preferred embodiments the sensors are Hall cells, and when the first and second sensor signals are subtracted, the summer preferably provides amplification, either before or after subtracting the first and second signal. The peak detect block has a rectifier that receives and flips up negative peaks in the difference signal so that peak detection circuitry detects only positive peaks. The peak detect block also includes a clocked device, such as a D-type flip-flop, which receives the difference signal as data and latches according to a clock signal from peak detection circuitry. With a flip-flop, it is further preferable that the peak detect block include a comparator for comparing the difference signal and a reference voltage and for enabling the clock signal only when the comparison indicates that the difference between the difference signal and the reference signal is sufficiently large—a condition that should only occur during a transition, such as that between a tooth and a notch. The comparator thus helps avoid detection and subsequent latching due to spurious peaks. A rectifier may be omitted, in which case the peak detection circuitry should be able to detect both positive and negative peaks. In this case, the peak detect block preferably includes a Schmitt trigger comparator to latch the state of a positive or negative peak.

The present invention also provides a method for sensing a body with first and second magnetic field sensors. The method includes the steps of receiving signals from each of first and second sensors, producing a subtracted signal indicating a difference between the first and second sensor signals, and detecting peaks of the subtracted signal to indicate locations of transitions in the body. The peaks indicate locations of edges with an offset that is fixed for a given body. This offset can be compensated mechanically by altering the sensed body, or with software.

In preferred embodiments, the method also includes steps of amplifying the subtracted signal (or amplifying the sensor signals before taking a difference), rectifying the difference signal, providing a flip-flop clocked output device that is clocked at least in part by the output signal from peak detection circuitry, and providing a comparator that enables and disables the output signal from the peak detection circuitry in response to a comparison between the difference signal and a reference signal. If the rectifier is omitted, the peak detection circuitry can detect both positive and negative peaks.

A sensor according to the present invention can be used, for example, in an automobile for sensing ignition timing, fuel injection, engine speed, wheel speed in ABS braking systems, and transmission control and timing.

The present invention thus provides a method and apparatus for detecting transitions in a body being sensed along a sensitive axis, while the detection is insensitive to movement transverse to the sensing axis, does not add noise, and does not expand the dynamic range of the sensor. Other features and advantages will become apparent from the following detailed description, drawings, and claims.

DETAILED DESCRIPTION

Figure 1:
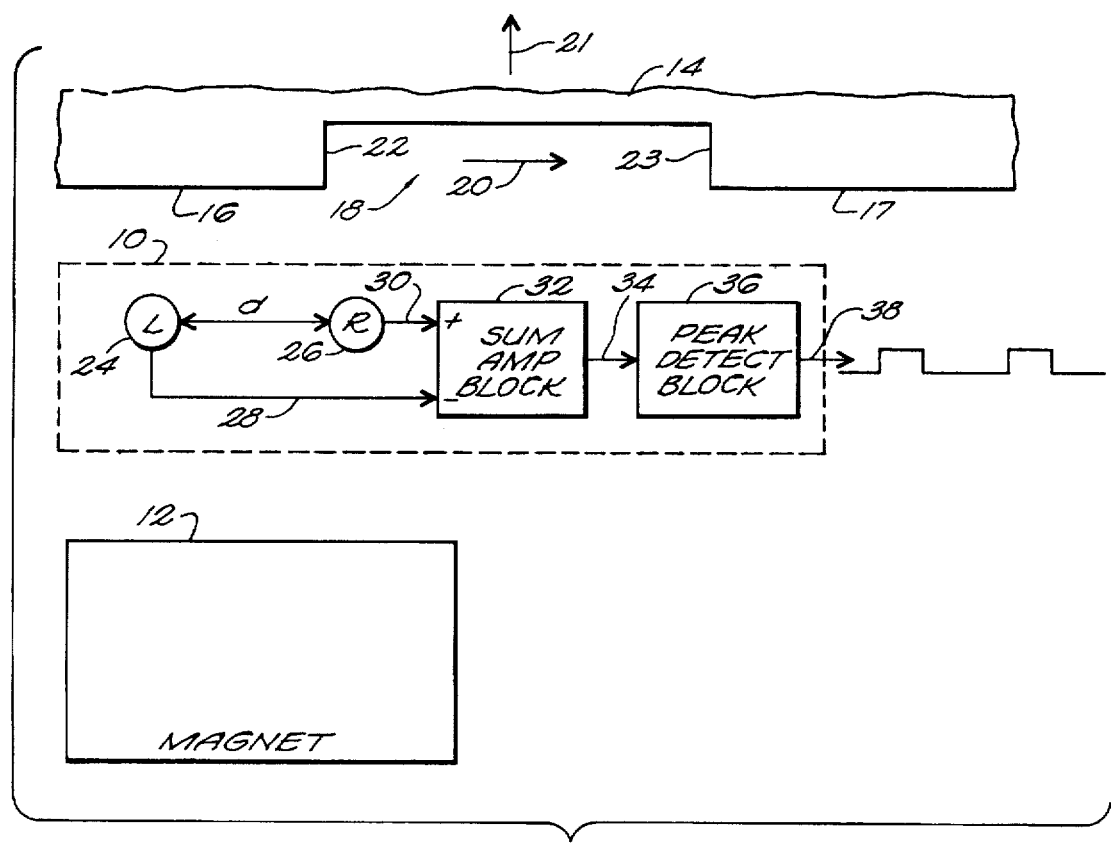
FIG. 1 is a pictorial and functional block diagram illustrating the use of a magnetic field sensor according to a first embodiment of the present invention.

Referring to FIG. 1, a sensing device 10 is positioned between a permanent magnet 12 and a body 14 that is being sensed. Body 14 has teeth 16, 17 and a notch 18 between the teeth. Teeth 16, 17 and notch 18 transition at edges 22 and 23. Edge 22 can be considered a leading edge of notch 18 or a trailing edge of tooth 16. During sensing, body 14 moves along a sensing axis 20, which is transverse to an axis 21 along which magnet 12, sensing device 10, and body 14 are aligned.

Sensing device 10 is preferably provided as an integrated circuit (IC) that has two Hall cells 24 and 26, identified as left (L) and right (R) spaced apart a fixed distance d, typically 1–3 mm, and circuitry for processing signals received from the Hall cells. Each Hall cell is preferably a quad Hall cell arrangement, a type that reduces offsets caused by temperature changes, and is oriented to provide a differential output signal that indicates an electric field that is related to the magnetic field along axis 21. Cells 24, 26 are preferably positioned centrally relative to the magnet so that the cells sense the identical magnetic field in the absence of a variation in the sensed body.

In response to a magnetic field between magnet 12 and body 14, cells 24 and 26 produce respective differential output signals 28 and 30 (and therefore would actually be provided over pairs of lines). The Hall cells are biased with equal currents (see also FIGS. 3, 4, and 12) so that output signals 28 and 30 are about equal when there is no difference in the spatial gap between the sensed body and each of the cells. Output signals 28 and 30 are provided to a summing amplifier 32, which amplifies output signals 28 and 30, and subtracts the amplified signals to produce an amplified difference signal 34 (the term summing and summer are used to refer generally to an arithmetic operation and a device that performs an arithmetic operation, including subtraction). The gain from amplification, preferably about 100, is useful because the signals from the Hall cells are typically small, e.g., about 10–40 microvolts per Gauss. Alternatively, output signals 28 and 30 can be subtracted first and then amplified.

Amplified difference signal 34 is provided to a peak detect block 36 that detects negative and/or positive peaks, and provides an output signal that transitions between high and low states to provide an essentially digital output signal 38. In this embodiment, digital output signal 38 is low when a tooth is sensed, and high when a notch is sensed.

The operation of sensing device 10 is more specifically described in connection with FIGS. 2(a) and 2(b). FIG. 2(a) pictorially represents the movement of a tooth relative to a pair of Hall cells, and FIG. 2(b) shows various signals generated during sensing of a moving body.

In this example, the distance d between a left Hall cell 52 and a right Hall cell 54 is 2 mm, and a tooth 50 is 20 mm wide and moves along axis 48 (left to right on FIG. 2(a)). As shown in the exemplary waveforms, the distance separating the two Hall cells is set so that the spatially changing magnetic field seen by the two cells clearly overlap with room for the cells to reach together the minimum and maximum fields, thus resulting in spaced peaks in the difference signal. Because d is small relative to the circumference of the moving body, the sensing axis seen by the two Hall cells is generally linear.

As tooth 50 sweeps across the face of a sensing device 10 and approaches left cell 52, that cell senses a change in the magnetic field due to an edge as shown in (a). Output signal 28 (row 1 in FIG. 2(b)) begins to rise as the magnetic field increases. If amplified difference signal 34 is R minus L (row 3), signal 34 begins to go negative. As tooth 50 moves 2 mm along axis 48 as shown in (b), output signal 30 (row 2) from right cell 54 similarly begins to rise. As the edge passes near the center of the two Hall cells as shown in (c), output signal 28 bottoms out and begins to rise. After a transition period for each cell as shown in (d), both signals become equal again at a level of maximum magnetic field (max field). As a trailing edge of a to tooth approaches left cell 52 as shown in (e), and then right cell 54 as shown in (f), output signal 28, and then output signal 30 decline to a signal of minimum magnetic field (min field). At the same time, signal 34 begins to rise. When the edge is between cells 52 and 54 as shown in (g), signal 34 peaks, and then begins to decline.

Figure 2:
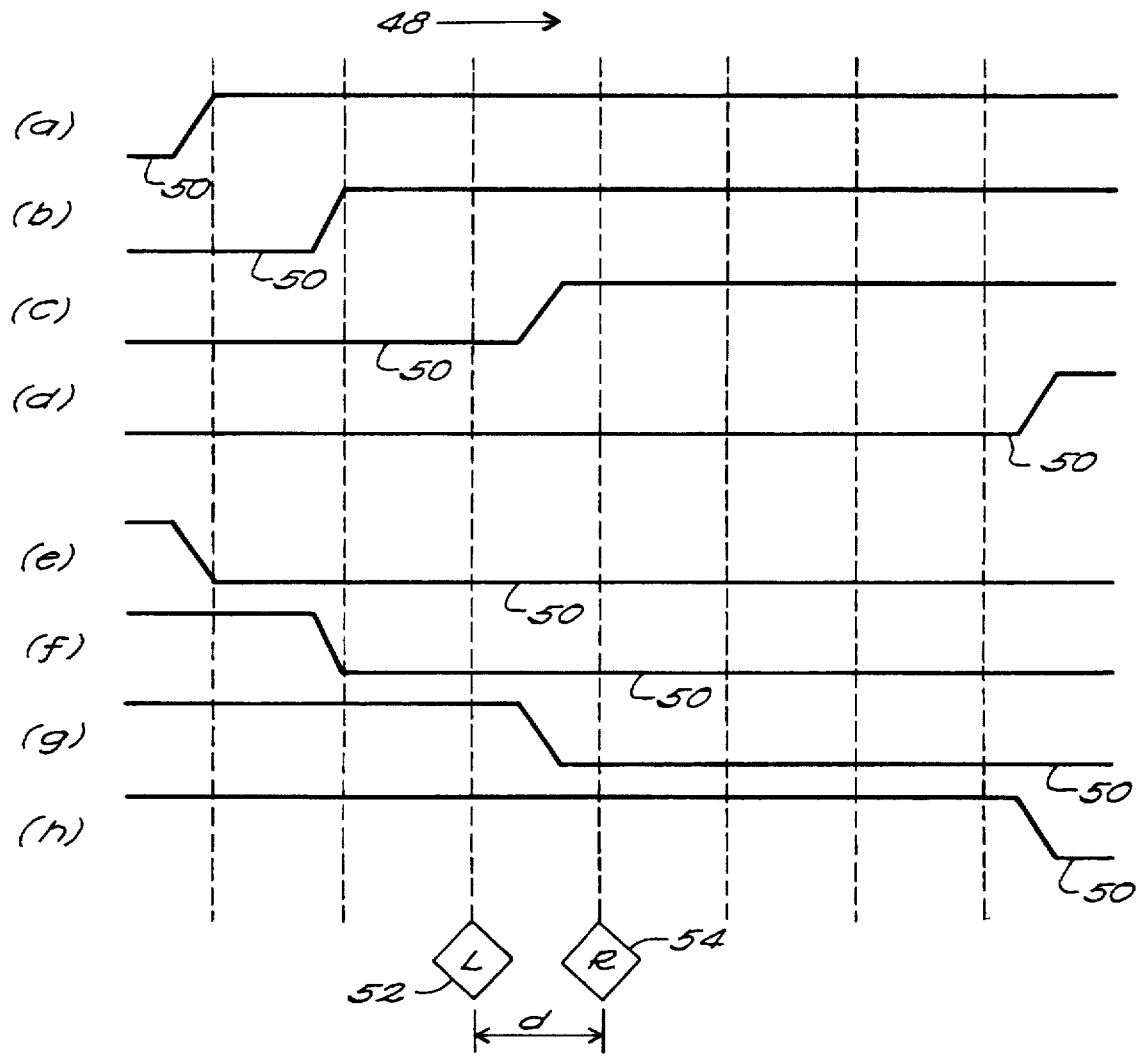
FIGS. 2(a) and 2(b) are graphs illustrating the movement of a body relative to two cells, and signals received at different stages of detection.
Figure 2B:
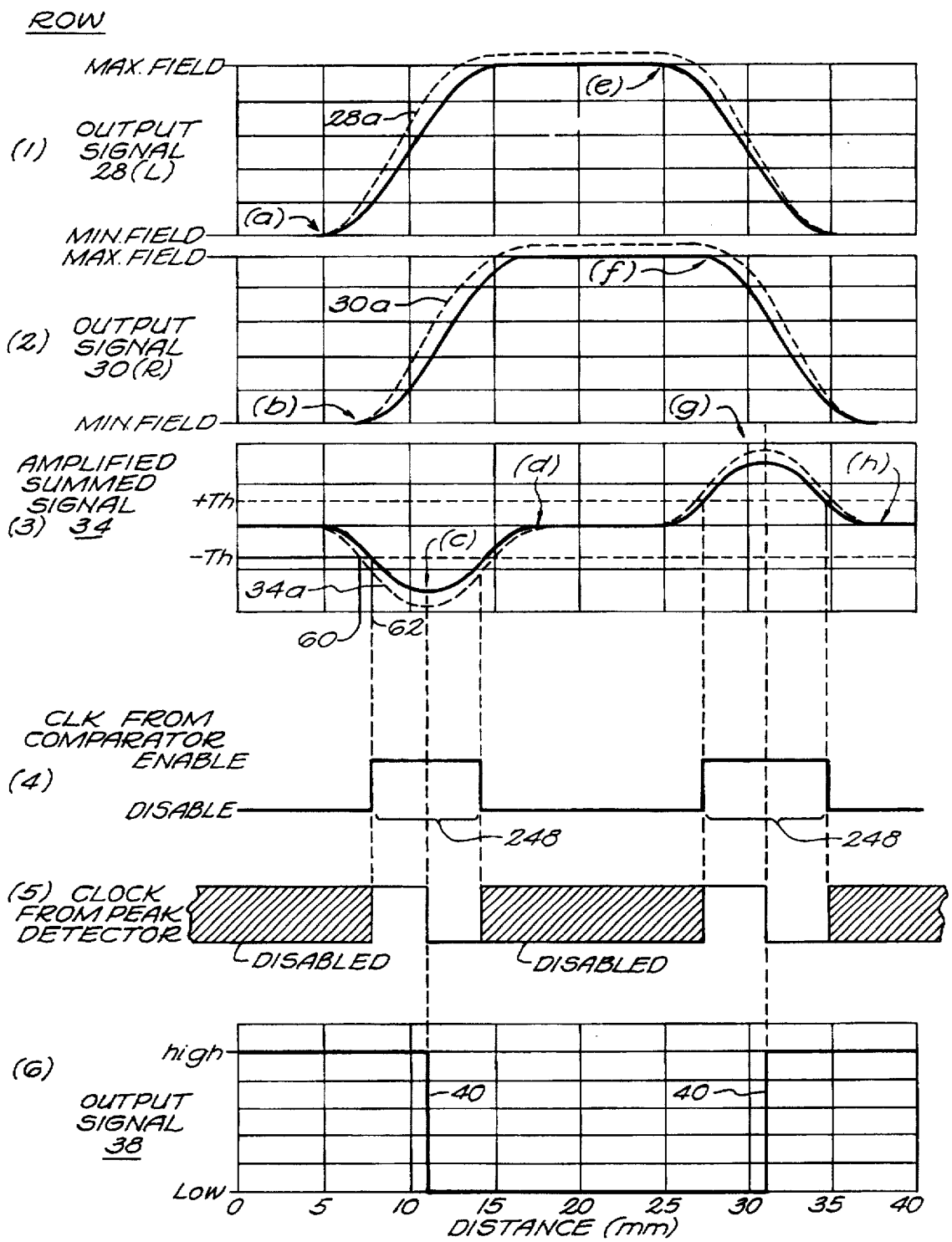

When peak detection circuitry in peak detect block 36 detects the peaks indicated at (c) and (g), it switches states with transitions 40 (FIG. 2(b), row 6) to produce an essentially digital signal. The CLK signals in rows 4 and 5 will be discussed below in conjunction with the third embodiment.

With this description, the benefits of a sensor according to the present invention are explained in more detail. If body 14 is a cam shaft of an automobile, for example, it can move not only along axis 20 or axis 48 (as it is supposed to), but it can also move along axis 21 (FIG. 1) due to a number of different causes, such as motor runout, vibrations, inconsistencies in manufacturing, or weakness in the bearings. Such movement affects the signals sensed by the cells, but these effects are not linear. Referring to FIG. 2(b), if the body moves closer to the sensor, the minimum field will increase slightly, but the maximum field will increase much more than the minimum field. Consequently, output signals 28a, 30a (shown in FIG. 2(b) in dashed line) will rise faster and higher, thus causing a difference signal 34a to rise and fall more steeply to higher and lower peaks.

If a comparator is used to sense a threshold crossing of difference signal 34 at defined threshold with magnitude ±Th, the thresholds can be crossed at different points along the distance axis as shown at location 60 and 62, depending on how fast difference signal 34 rises. If location 62 is where a crossing should be, and if the circuitry senses the edge at location 60 due to transverse movement, the system would determine that the body is moving faster than it is, or that the tooth is wider than it is. Because these crossing points can vary spatially, the sensing of an edge relative to a crossing can also vary, thus affecting the accuracy of the sensor.

It has been found that peaks of the difference signal, as shown at (c) and (g) in row 3 of FIG. 2(b), are more closely and consistently spaced from an edge for a given body than are threshold crossings. As shown in FIG. 2, the peaks of signal 34 occur at about the same location along the spatial axis, regardless of transverse movement by the body. Sensing the peaks rather than certain threshold crossings thus results in a more accurate determination of the location of the edge.

Figure 3:
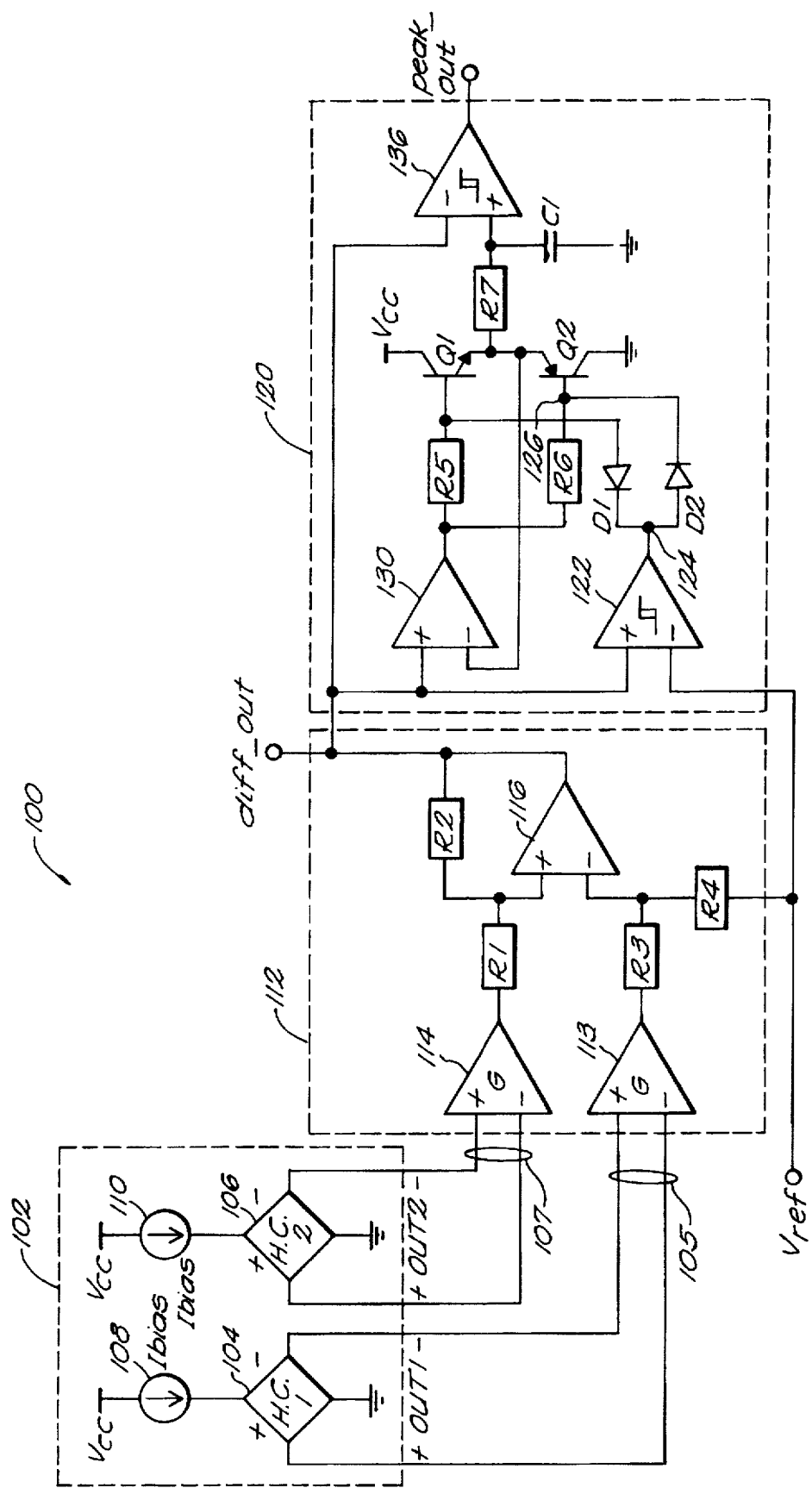
FIG. 3 is a schematic block diagram of a sensor according to a second embodiment of the present invention.

Referring to FIG. 3, in a second embodiment of the present invention, a sensing device 100 has a sensing block 102 with first and second Hall cells 104 and 106, biased with current $I_{bias}$ from equal current sources 108 and 110. Hall cells 104 and 106 provide differential output signals OUT1 and OUT2 over lines 105, 107 to a summing amplifier block 112 which has amplifiers 113, 114 that amplify signals OUT1 and OUT2 with gain G. Assuming R1=R2=R3=R4, amplified signals G(OUT1) and G(OUT2) are added to Vref with an amplifier 116 to produce an output signal diff_out. The reference voltage Vref is summed to add a DC bias term to the difference in the signals from the Hall cells. This bias is useful if there is one supply voltage Vcc, in which case Vref is preferably about Vcc/2, thus allowing the amplified difference signal to have a dynamic range of about ±Vcc/2.

A peak detect block 120 has circuitry for detecting both positive and negative peaks of diff_out. Diff_out and Vref are each provided to a first comparator 122, which has an output node 124 coupled to first terminals of a reverse biased diode D1, and a forward biased diode D2. Second terminals of diodes D1 and D2 are coupled to the bases of npn transistor Q1 and pnp transistor Q2, respectively. Diff_out is also provided to a non-inverting input of a first op-amp 130, which has an output lead coupled to the base of npn transistor Q1 through a resistor R5, and to the base of pnp transistor Q2 through resistor R6. The emitters of transistors Q1 and Q2 are coupled together and to the inverting input of op-amp 130 and to a first input of a second comparator 136 through a resistor R7. The first input is also connected to a capacitor C1 to ground. A second input to comparator 136 is coupled to diff_out.

For positive peaks, when diff_out>Vref, the output of first comparator 122 is high, thus disabling transistor Q2 through diode D2. The emitter of transistor Q1 follows diff_out and charges capacitor C1 through resistor R7. Second comparator 136 compares the voltage held by capacitor C1 to diff_out.

After diff_out peaks and begins to decline, the output signal of comparator 122 transitions high once the difference between the voltage on C1 and diff_out at its inputs is greater than a built-in hysteresis of comparator 136.

When diff_out<Vref, comparator 122 disables transistor Q1 through diode D1, and op-amp 130 drives transistor Q2 through resistor R6 so that the emitter of transistor Q2 follows diff_out and discharges capacitor C1 through resistor R7. The peak negative voltage is held on capacitor C1, and comparator 136 compares the voltage on capacitor C1 to diff_out. When diff_out increases by more than the hysteresis of comparator 136, the output of comparator 136 transitions low.

The hysteresis is therefore useful in the second comparator for noise immunity by providing small thresholds, and is useful in the first comparator to allow for offsets in the Hall cell outputs which make Vref not equal to diff_out when the Hall cells experience equal magnetic fields. Resistors R5 and R6 are chosen so that the output of op-amp 130 is not disturbed by diodes D1 and D2, respectively.

FIGS. 4–11 are detailed schematics that illustrate additional features and aspects of a sensing device 200 according to a third embodiment of the present invention.

Figure 4:
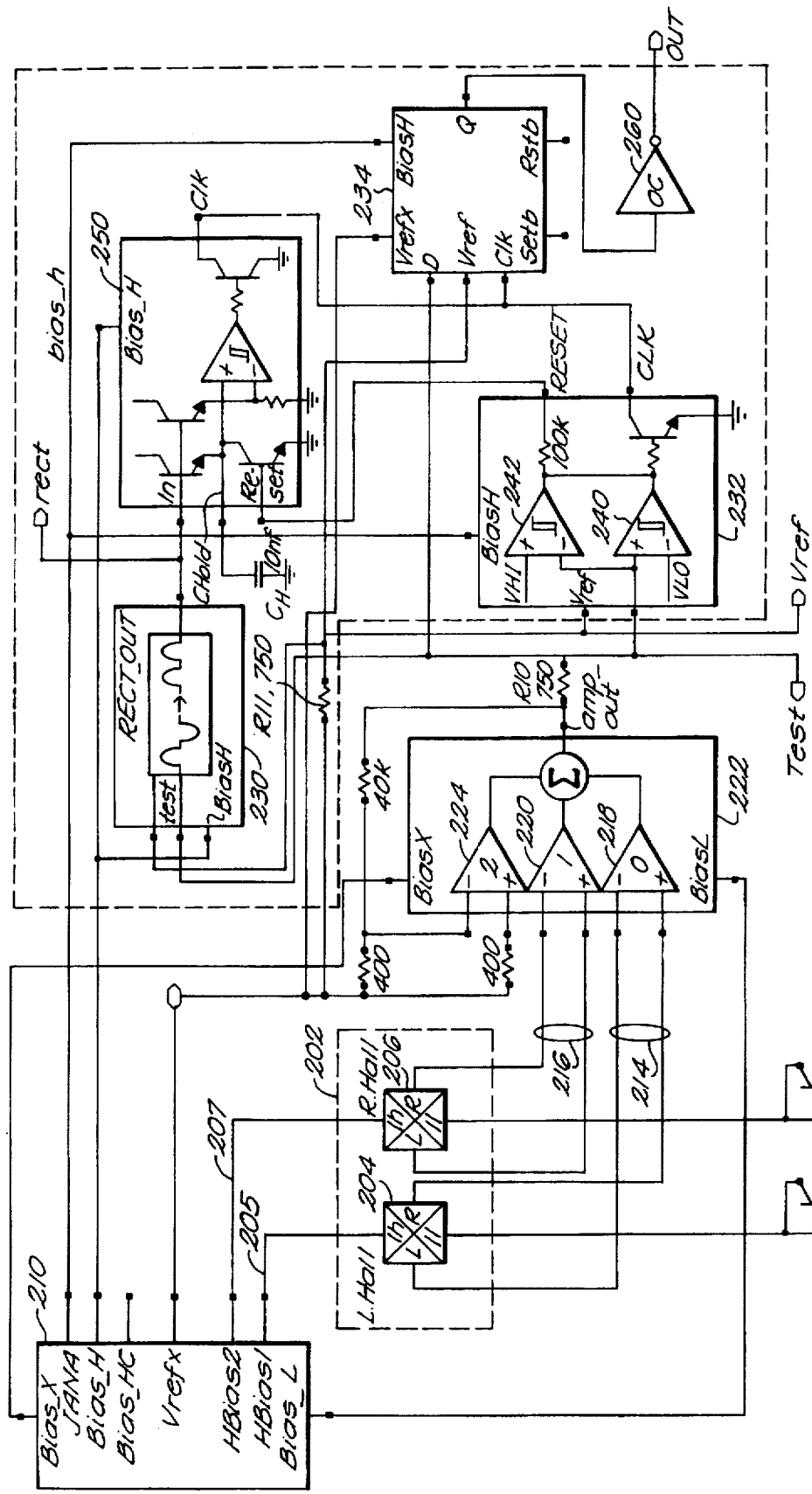
FIGS. 4–11 are schematics of a sensor according to a third embodiment of the present invention.
Figure 5:
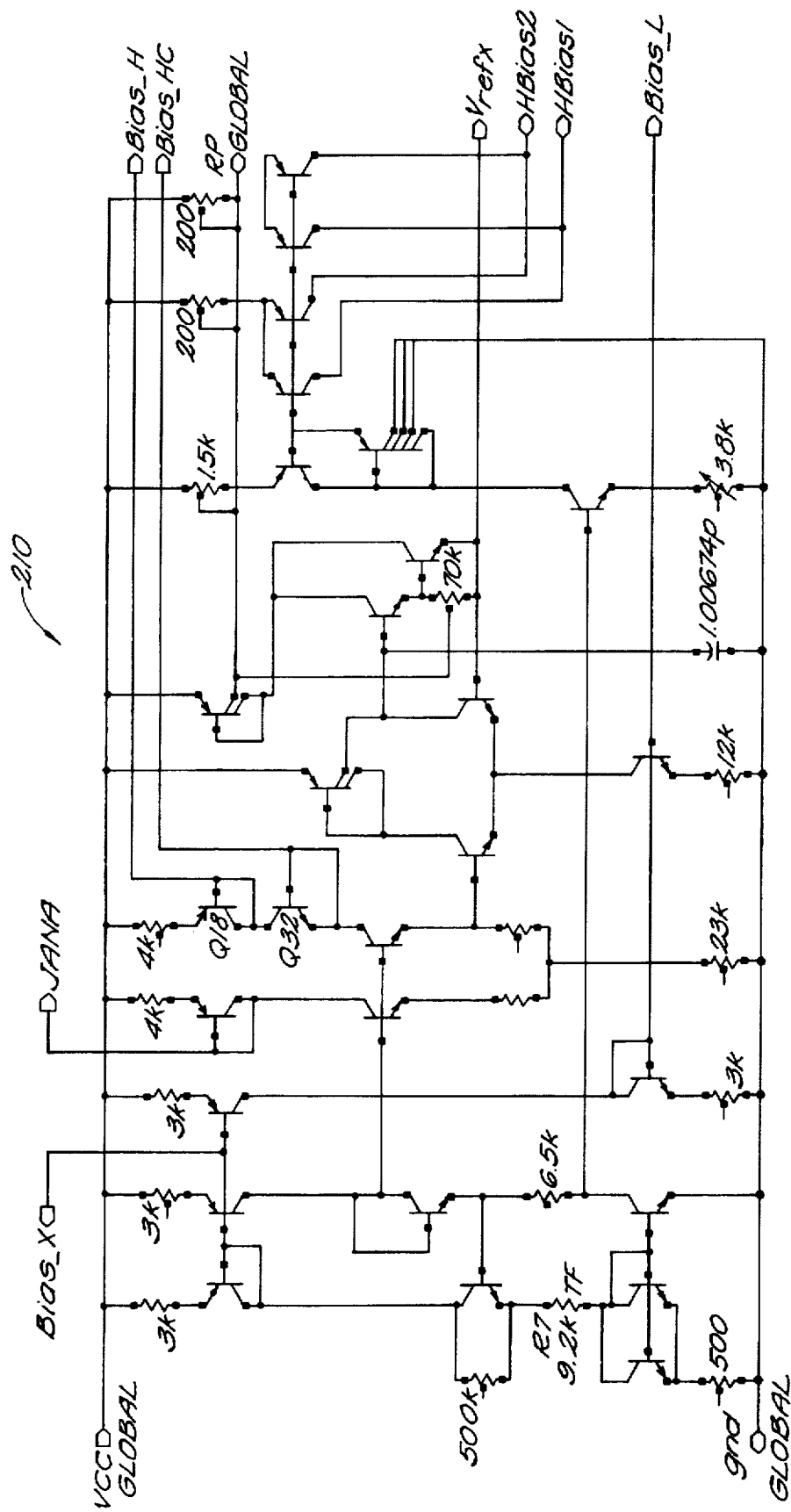

Referring to FIG. 4, sensing device 200 has a sensing block 202 with a left Hall cell 204 and a right Hall cell 206. A bias circuit 210 provides equal bias currents HBias1 and HBias2 to the Hall cells over lines 205 and 207. Bias circuit 210, which is shown in more detail in FIG. 5, receives a single supply voltage Vcc and provides the bias currents to the Hall cells, as well as bias voltages to various transistor current sources, and a reference voltage Vrefx.

Figure 6:
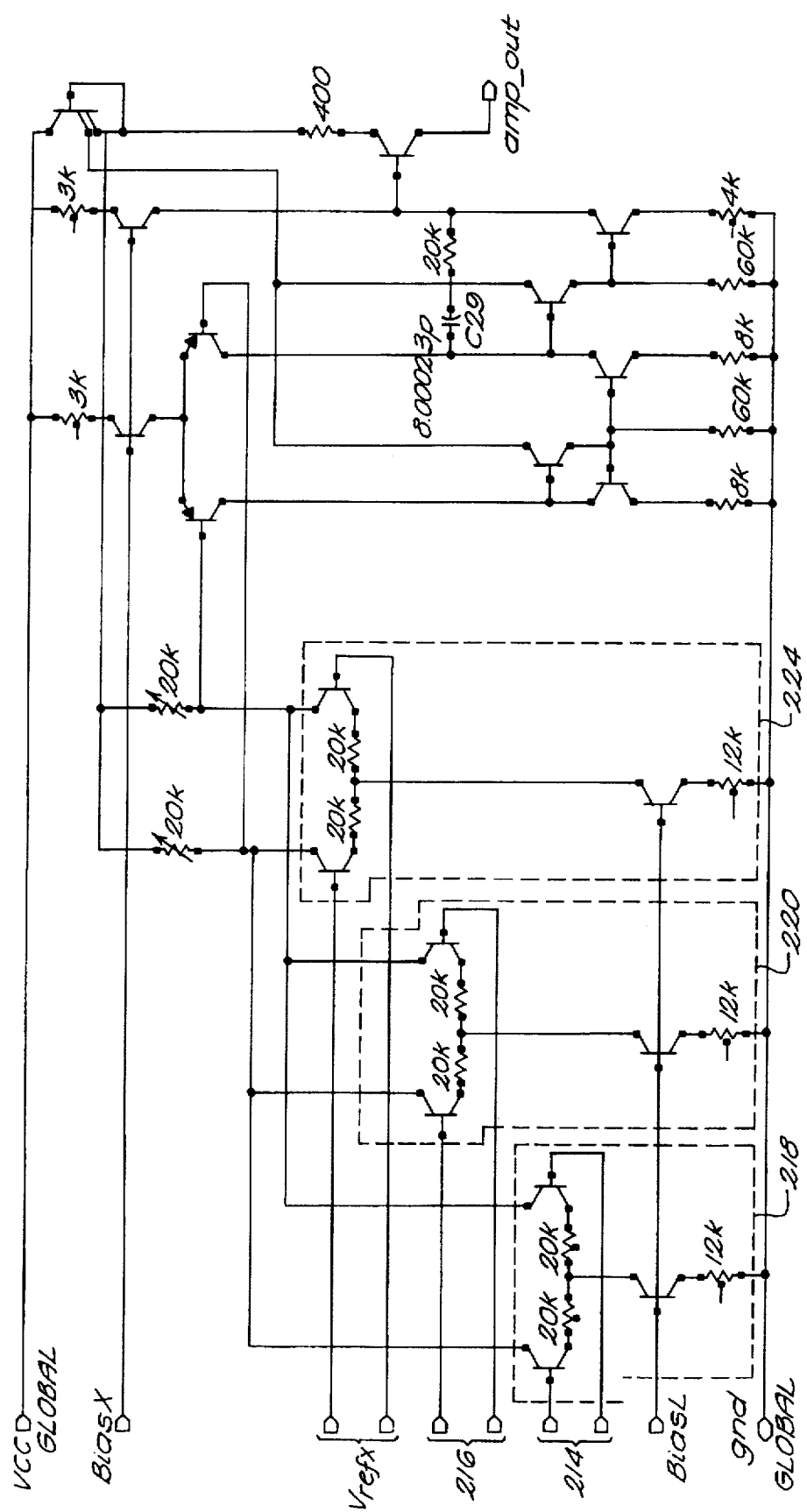

Hall cells 204 and 206 provide differential output signals over lines 214 and 216 to amplifiers 218 and 220 in a summing amplifier 222, as shown in FIG. 6. Meanwhile, bias circuit 210 provides reference voltage Vrefx, preferably about Vcc/2, e.g., 2.4 V for Vcc of 4.8 V minimum, to a follower amplifier 224 in amplifier 222. These signals are summed and are provided to buffering circuitry in summing amplifier 222. The resulting output signal amp_out from summing amplifier 222 can thus be generally expressed as follows:

$$amp\_out=G(L\_Hall-R\_Hall)+Vrefx;$$

where L_Hall and R_Hall are the signals from cells 204 and 206 on lines 214 and 216, respectively, and G is the gain of summing amplifier 222, preferably about 100.

Referring again to FIG. 4, output signal amp_out from summing amplifier 222 is provided via a resistor R10 to a pad Test, while Vrefx is coupled to a pad Vref through a resistor R11. Pads Test and Vref allow external trimming that compensates for inevitable offsets in (non-ideal) summing amplifier 222 and differences in the output signals from the Hall cells due to die stress or mismatched initial field levels.

The thus-trimmed output signal Test from summing amplifier 222 and reference signal Vref are provided to peak detect block 228 that includes a rectifier 230, a window comparator 232, peak detection circuitry 250, a D-type flip-flop 234, and an output buffer 260.

Figure 7:
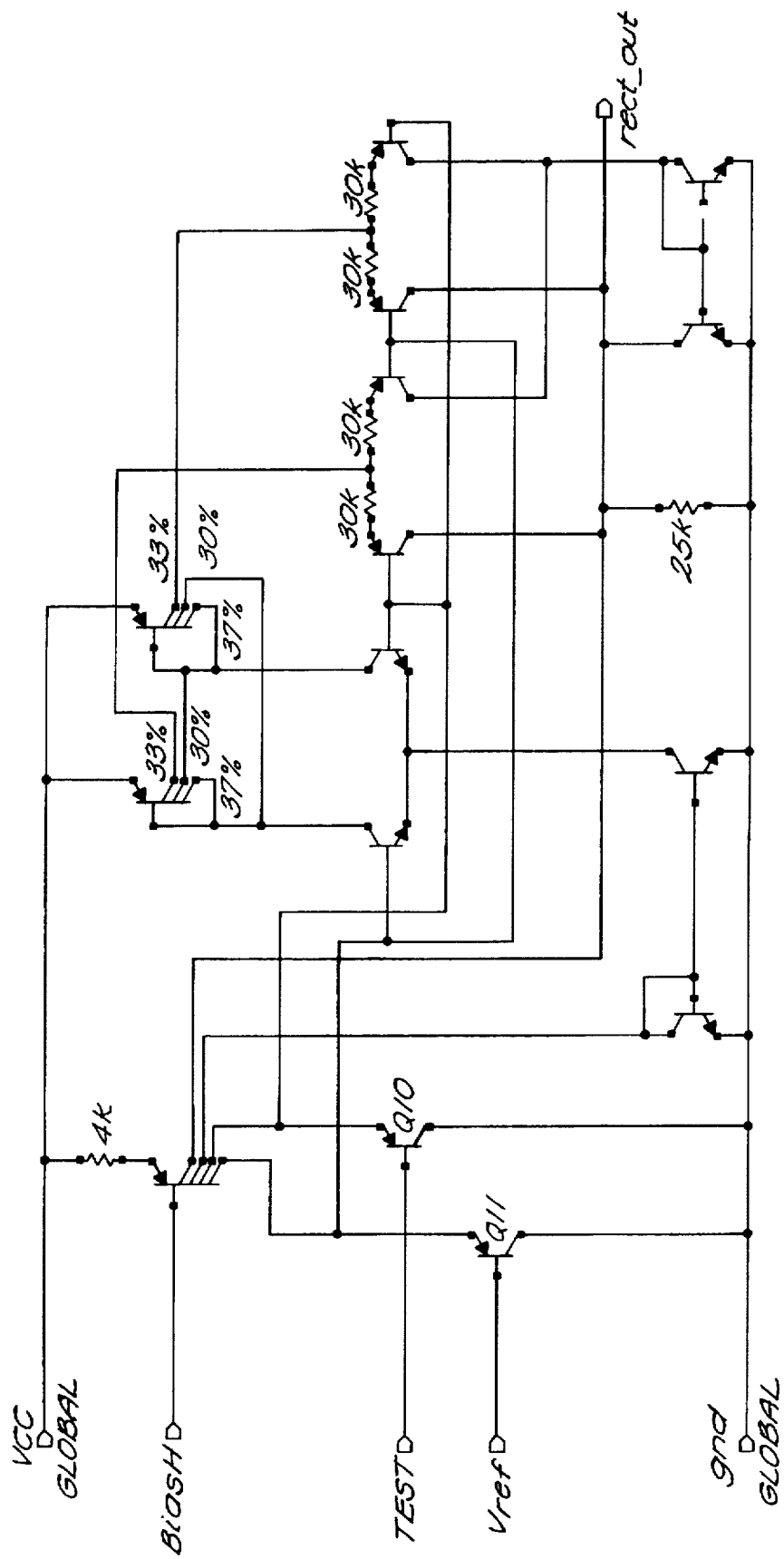

Referring also to FIG. 7 which shows rectifier 230 (FIG. 4) in more detail. Test and Vref signals are provided to pnp transistors Q10 and Q11 which buffer and increase the signals by a voltage $V_{BE}$. The scaled-up Test and Vref signals are provided to differential amplifiers that provide an output signal rect_out according to the following equation:

$$rect\_out = SF * ABS\{Test - Vref\} + V_{OFF};$$

where SF is a constant scaling factor; ABS indicates absolute value; and $V_{OFF}$ is typically about 0.4 V. Rectifier 230 thus flips up the negative peaks so that peak detection circuitry 250 that receives rect_out need only detect positive peaks. While preferably SF=0.625 (constant), in reality, with a bipolar design, the actual output is not quite linear in that the actual scaling factor is greater when the difference between the test voltage and the reference voltage is less than a certain threshold, e.g., 60 mv. This nonlinearity is useful because it provides more gain to small signal differences.

Figure 8:
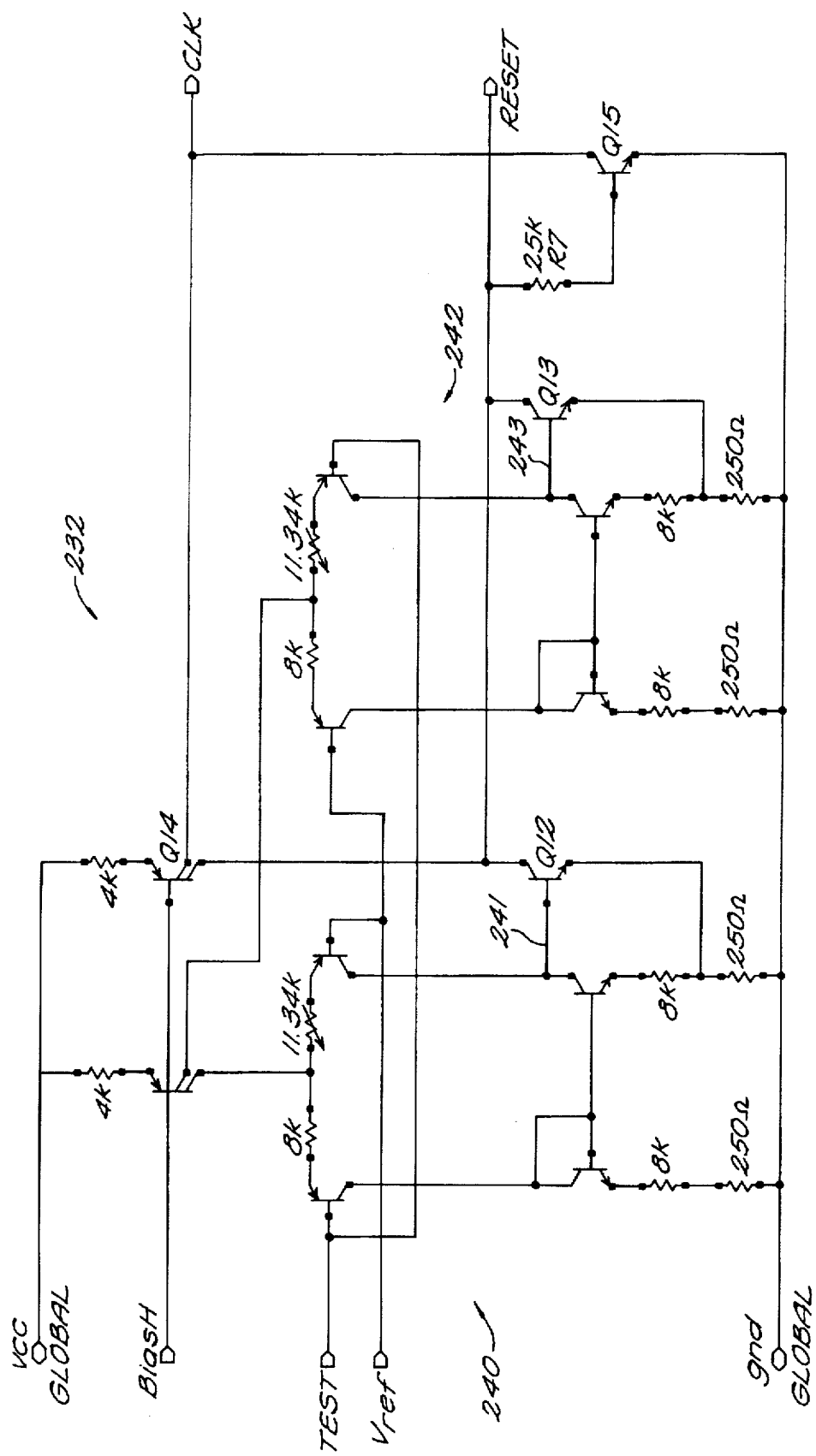

Signals Test and Vref are also provided together to window comparator 232, shown in more detail in FIG. 8. Comparator 232 compares the input signals and provides an open collector CLK signal output to the flip-flop and a RESET signal to peak detector 250. Test and Vref are provided to comparators 240, 242 which have outputs lines 241, 243 coupled to the bases of npn transistors Q12 and Q13. When Test and Vref are close together, no signal appears on lines 241 and 243, and no current flows through transistors Q12 and Q13. As a result, the current from one collector of transistor Q14 provides base current to transistor Q15 through resistor R7 to pull the CLK output to ground.

When the deviation between Test and Vref is sufficient, one of transistors Q12 and Q13 conducts, causing RESET to go low and causes CLK to go high. Referring also to FIG. 2(b), window comparator 232 provides a CLK signal (row 4) that is high to allow data to be latched into flip-flop 234 only during windows 248 when Test deviates significantly from Vref, a condition that occurs during the sensing of an edge. These windows thus prevent latching during false peaks. Through the RESET line, the comparator enables and disables charging of a capacitor in peak detection circuitry 250 as shown below.

Figure 9:
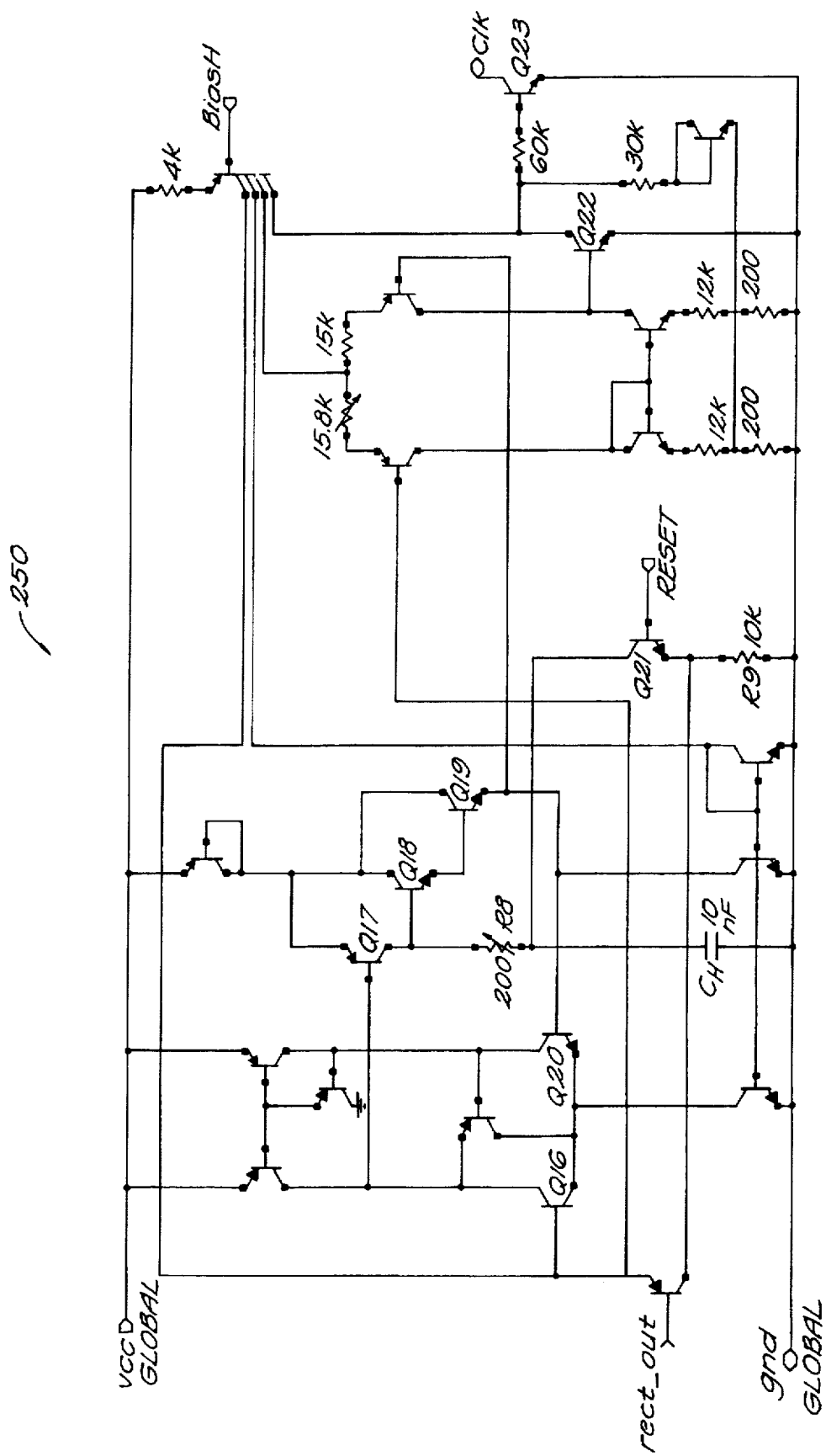
Figure 10:
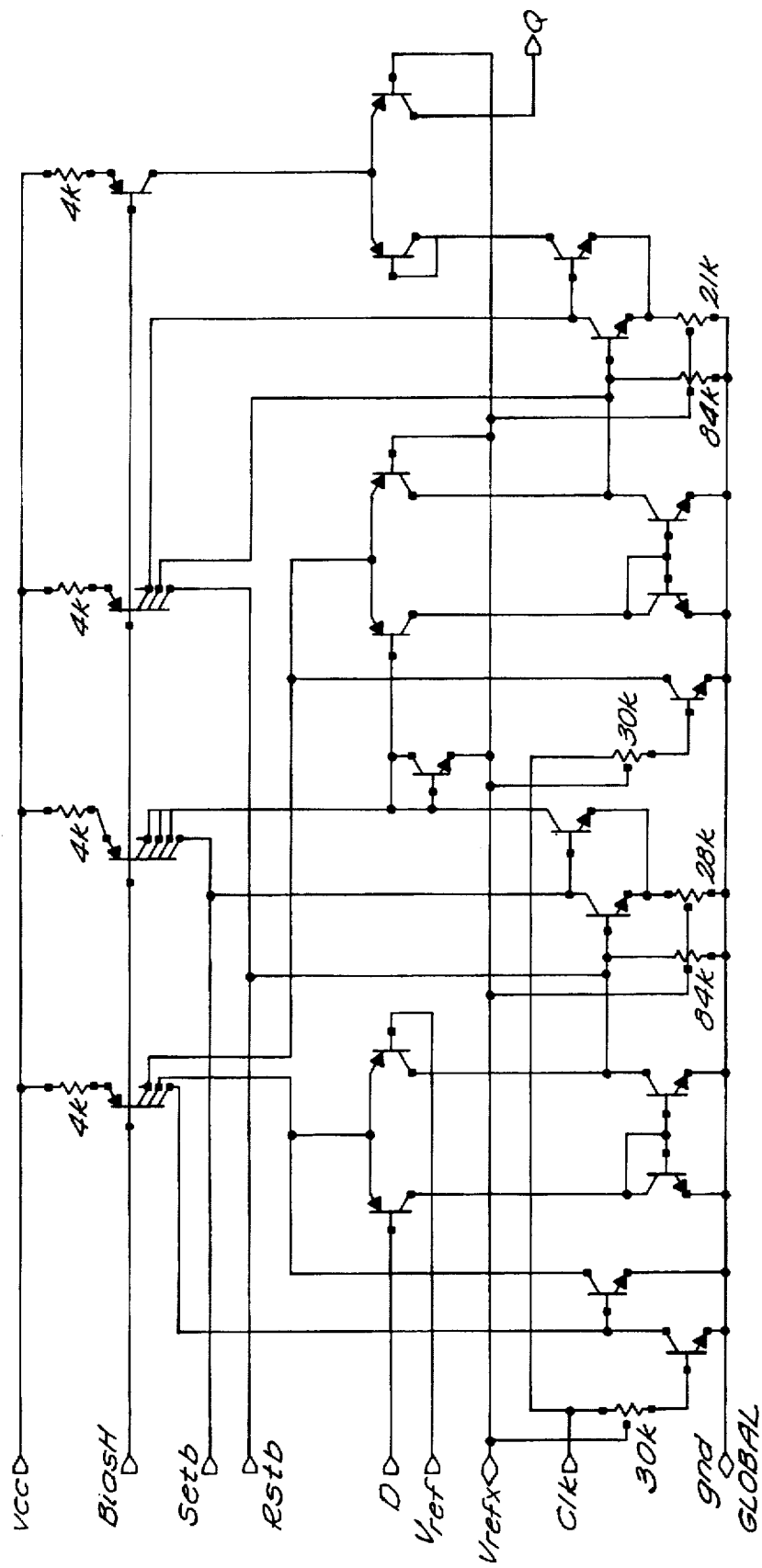

Referring to FIG. 9, peak detection circuitry 250 receives rectified output signal rect_out and provides an open collector output CLK (FIG. 2(b), row 5) to the flip-flop. Peak detection circuitry 250 is coupled to an external holding capacitor $C_H$ for holding peak values. As input signal rect_out goes up, transistor Q16 conducts more and transistor Q17 turns on, thus causing $C_H$ to be charged through resistor R8; meanwhile, the voltage at the base of transistor Q18 increases, so the darlington transistor pair Q18 and Q19 increase the base voltage of transistor Q20 until it equals that of the base of transistor Q16. As long as RESET is off or low, $C_H$ cannot discharge (except for very little base current through the darlington transistor pair). When the RESET signal from the window comparator is temporarily activated or high due to no sensed deviation between Vref and Test in window comparator 232, $C_H$ discharges through transistor Q21 and resistor R9 until dissipated, and RESET then goes low to allow capacitor $C_H$ to be charged up again.

When the base voltage of transistor Q16 (rect_out+$V_{OFF}$) is sufficiently different from the signal at the base of transistor Q20, transistor Q22 turns off and transistor Q23 turns on, thus causing the output line CLK to go to ground, and thus the output of the peak detection circuitry switches low when a positive peak is detected as shown in FIG. 2.

The open collector output of the peak detector is provided to the clock input of flip-flop 234. On the falling clock edge of CLK, positive data is latched if the voltage at the D input greater than $V_{ref}$ and negative data is latched if the voltage at the D input is less than the reference voltage.

Figure 11:
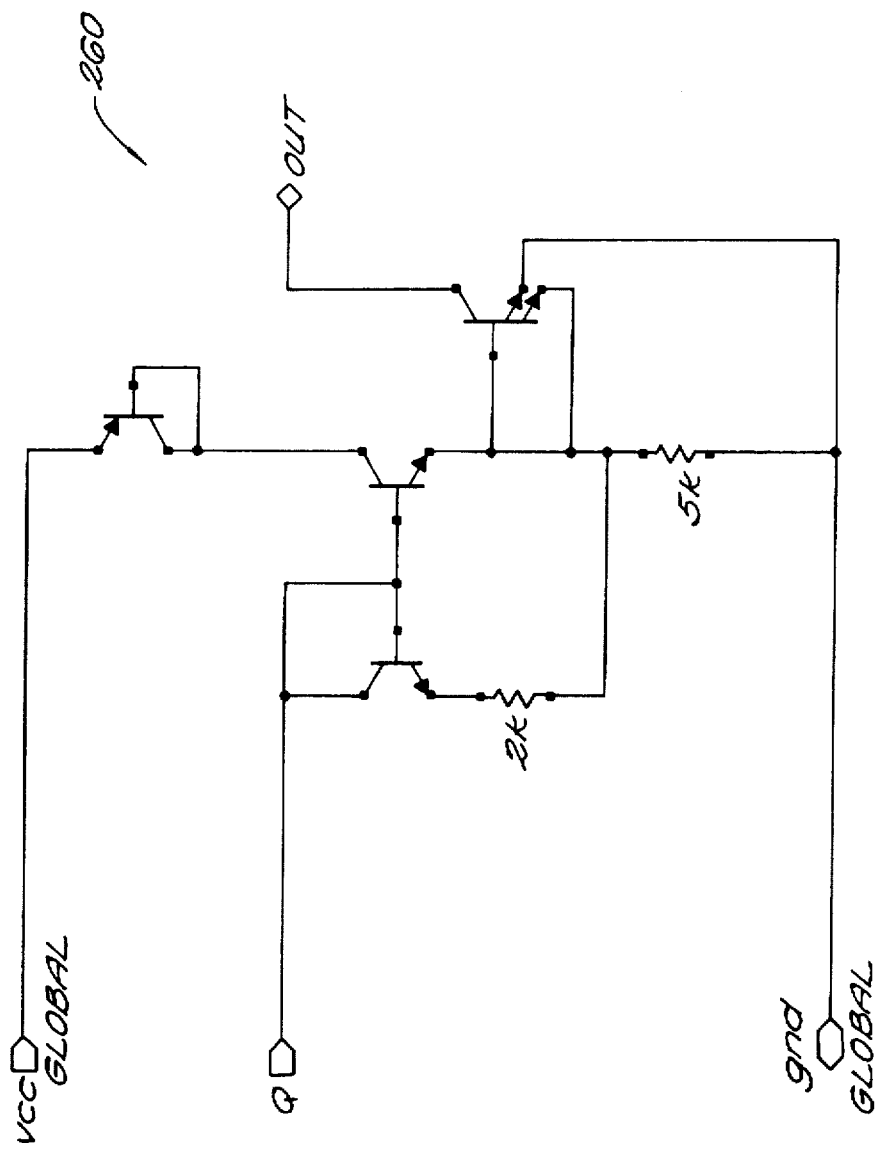

Referring also to FIG. 11, an output buffer 260 receives signal Q from flip-flop 234 as an input and provides an output signal OUT to other circuitry.

Figure 12:
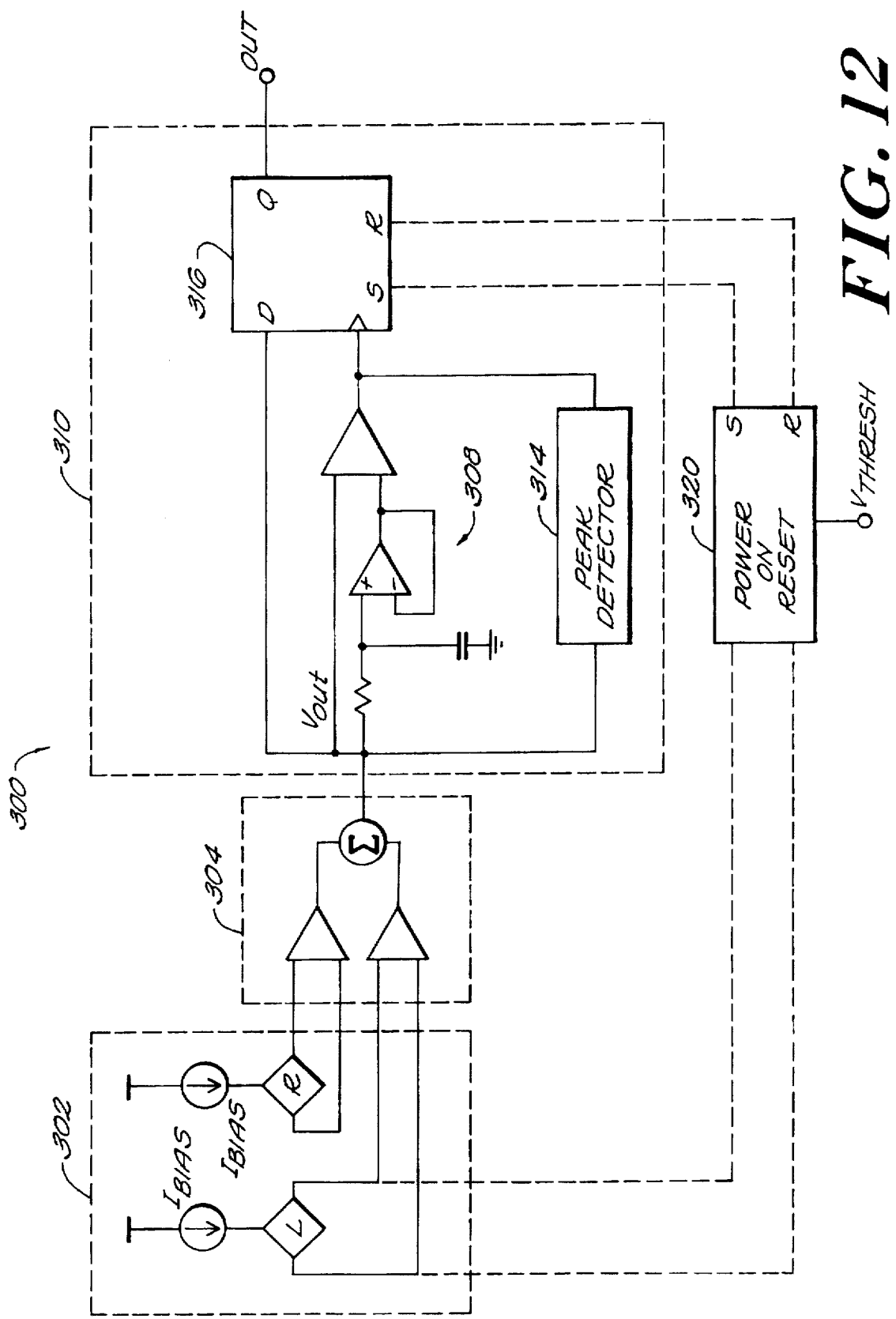
FIG. 12 is a schematic block diagram of a sensor according to a fourth embodiment of the present invention.

Referring to FIG. 12, in a fourth embodiment, sensing device 300 has a sensing block 302 and a summing amplifier 304 similar to previous embodiments to provide an amplified difference signal $V_{out}$ to a peak defect block 310 for detecting peaks and providing an output signal OUT. This signal is provided to a window comparator 306, which also receives a low-pass filtered and buffered version of $V_{out}$; a peak detector 314; and a D-type flip-flop 316.

Window comparator 306 compares $V_{out}$ to a version of $V_{out}$ filtered by low-pass filter 308 to obtain a DC component, and provides the clock signal CLK to flip-flop 316. The window comparator thus keeps $V_{out}$ from being latched into the D input of flop-flop 316 until $V_{out}$ deviates significantly from its DC value. Consequently, peak detector 314 and window comparator 306 only allow data to be latched when an edge is occurring.

Sensing device 300 also has a power-on reset 320. When the supply is applied to the pair, the output of one sensor (L) is compared to an externally or internally provided threshold voltage Vthresh. If the voltage out of the Hall cell is larger than Vthresh, the IC is over a tooth (high field); if the voltage out of the Hall cell is smaller than Vthresh, then the IC is over a notch (low field). Power-on reset 320 sets or resets the output of the flip flop according to whether the IC is over a tooth or a notch. After setting or resetting the flip flop, power-on reset 320 is disabled so as to not further affect operation of the IC.

Figure 13:
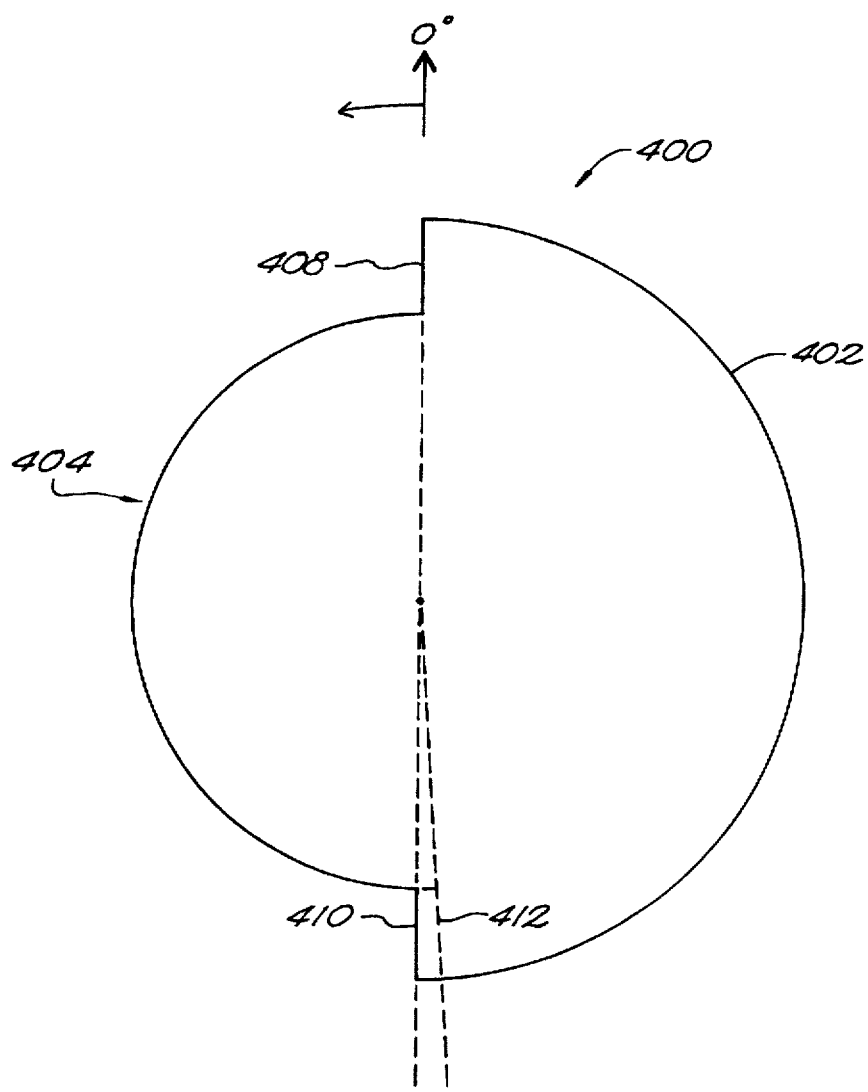
FIG. 13 is a cross-sectional view of a sensed body altered according to the present invention.

FIG. 13 illustrates an example of how the detected information obtained according to the present invention can be used to improve performance of a body 400 that rotates counter-clockwise. In this example, body 400 has a tooth 402 and a notch 404, each of which is 180°. Tooth 402 can be altered to take advantage of the more consistent measurement of the present invention. If it is determined, for example, that a peak of the amplified difference signal lags the edge by about 1° and a user desires to know when an edge 408 is at 0°, 1° of tooth 402 can be cut out at edge 410 to make a new edge 412. By the time edge 412 is detected, edge 408 is at 0°. Alternatively, the difference can be compensated in software that acts in accordance with the output signals.

As also suggested by FIG. 13, the terms tooth and notch are meant to be used broadly to cover any relative spatial transition detected in a sensed body along an axis transverse to a sensitive axis, and not just for small serrated or square teeth as in a cutting blade. Rather, the terms tooth and notch are used here as relative terms of reference, where a notch could be considered the absence of a tooth and a tooth could be considered a portion between ends of one or more notches.

Having described a preferred embodiment of the present invention, it should be apparent that other modifications can be changed without departing from the scope of the appended claims.

What is claimed is:

1. An apparatus for sensing spatial transitions in a moving body, the apparatus comprising:

a first sensor that senses a magnetic field and provides a first sensor output signal representing the sensed magnetic field;

a second sensor that senses the magnetic field and provides a second sensor output signal representing the sensed magnetic field, the second sensor being spaced from the first sensor, wherein the apparatus has two and only two such sensors;

a summer that receives the first and second sensor output signals and provides a difference signal based on a difference between the first and second sensor output signals; and a peak detect block that receives the difference signal and provides a detector output signal that changes between a first state and a second state to indicate a peak in the difference signal, the detector output signal indicating the location of a spatial transition in the moving body, wherein the peak detect block includes a comparator and a peak detection circuit, the peak detection circuit receiving the difference signal and detecting peaks in the difference signal the comparator receiving and comparing the difference signal and a reference signal, and enabling and disabling the peak detect block from changing the state of the detector output signal in response to the comparison made by the comparator.

2. The apparatus of claim 1, wherein the first and second sensors are Hall cells.

3. The apparatus of claim 1, wherein the peak detect block includes a rectifier that rectifies the difference signal, and wherein the peak detection circuit receives the rectified signal and detects only positive peaks.

4. The apparatus of claim 1, wherein the peak detect block detects both positive and negative peaks.

5. The apparatus of claim 1, wherein the peak detect block further includes a flip-flop for receiving a clock signal derived at least in part from the output of the peak detection circuit, the flip-flop for providing the detector output signal and for changing between the first state and the second state in response to an enabling signal from the comparator.

6. The apparatus of claim 1, wherein the summer includes an amplifier for providing an amplified difference signal.

7. An apparatus for sensing spatial transitions in a moving body, the apparatus comprising:

a first sensor that senses a magnetic field and provides a first sensor output signal representing the sensed magnetic field;

a second sensor that senses the magnetic field and provides a second sensor output signal representing the sensed magnetic field, the second sensor being spaced from the first sensor;

a summer that receives the first and second sensor output signals and provides a difference signal based on a difference between the first and second sensor output signals; and a peak detect block that receives the difference signal and provides a detector output signal indicating a peak in the difference signal, the detector output signal indicating the location of a spatial transition in the moving body, the peak detect block including:

a low-pass filter receiving the difference signal and providing a filtered signal, a comparator receiving the difference signal and the filtered signal and providing a comparator output signal, a peak detection circuit for receiving the difference signal and for providing a peak detect output signal, and a docked output device for providing the detector output signal, the device having a data input lead for receiving the difference signal and a clock input lead coupled to receive the peak detect output signal and the comparator output signal.

8. The device of claim 7, wherein the first and second sensors are the only two magnetic field sensors in the apparatus.

9. A method for sensing spatial transitions of a moving body in a magnetic field using a sensing device having first and second spaced magnetic sensors that are the two and only two such sensors, the method comprising:

(a) receiving respective signals from the first and second sensors, each of the signals depending on the magnetic field sensed by the respective sensor;

(b) determining a difference signal based on the respective signals from the first and second sensors;

(c) determining peaks of the difference signal;

(d) providing an output signal that changes between a first state and a second state in response to the detection of peaks indicative of the locations of the spatial transitions; and (e) comparing the difference signal and a reference signal and enabling or inhibiting changes between the first and second states in response to the comparison.

10. The method of claim 9, further including a step of amplifying the first and second signals prior to step (b).

11. The method of claim 9, further comprising a step of rectifying the difference signal, step (c) including determining only positive peaks.

12. The method of claim 9, wherein step (d) includes providing an output from a docked device, the clock signal being received in response to step (c).

13. The method of claim 12, wherein step (d) includes a clocked device providing the output signal, and wherein step (e) includes controlling a clock signal to the clocked device such that the clocked device does not provide a new output unless the difference signal and the reference signal deviate by a sufficient amount.

14. The method of claim 9, further comprising a step of: (f) physically altering the moving body at a location of a spatial transition in accordance with the output signal provided in step (d).

15. An apparatus comprising:

a moving body having spatial transitions along a first axis;

a source of a magnetic field;

a first sensor that senses the magnetic field and provides a first sensor output signal representing the sensed magnetic field;

a second sensor that senses the magnetic field and providing a second sensor output signal representing the sensed magnetic field, the first and second sensors being spaced apart along an axis transverse to the first axis and being disposed between the moving body and the source of the magnetic field, the apparatus having two and only two such sensors;

a summer coupled to the first and second sensors, the summer providing a difference signal based on a difference between the first and second sensor output signals; and a peak detect block coupled to the summer, the peak detect block receiving the difference signal and providing a detector output signal that changes between a first state and a second state to indicate a peak in the difference signal, the detector output signal indicating the location of a spatial transition in the moving body the peak detect block including a comparator and a peak detection circuit, the peak detection circuit receiving the difference signal and detecting peaks in the difference signal the comparator receiving and comparing the difference signal and a reference signal, and enabling and disabling the peak detect block from changing the state of the detector output signal in response to the comparison.

16. The apparatus of claim 15, wherein the peak detect block includes a flip-flop for receiving a clock signal derived at least in part from the output of the peak detection circuit the flip-flop for providing the detector output signal and for changing between the first state and the second state in response to an enabling signal from the comparator.

17. The apparatus of claim 15, wherein the source includes a permanent magnet.

18. The apparatus of claim 15, wherein the moving body is a rotating body.

19. An apparatus for sensing spatial transitions in a moving body, the apparatus comprising:
- a first sensor that senses a magnetic field and provides a first sensor output signal representing the sensed magnetic field;
- a second sensor that senses the magnetic field and provides a second sensor output signal representing the sensed magnetic field, the second sensor being spaced from the first sensor;
- a summer that receives the first and second sensor output signals and provides a difference signal based on a difference between the first and second sensor output signals; and
- a peak detect block that receives the difference signal and provides a detector output signal indicating a peak in the difference signal, the detector output signal indicating the location of a spatial transition in the moving body, the peak detect block including:
  - a low-pass filter receiving the difference signal and providing a filtered signal,
  - a comparator receiving the difference signal and the filtered signal and providing a comparator output signal, and
  - a peak detection circuit for receiving the difference signal and for providing a peak detect output signal coupled to the output of the comparator, the comparator and peak detection circuit providing a signal in response to a transition.

20. The device of claim 19, wherein the first and second sensors are the only two magnetic field sensors in the apparatus.

21. The device of claim 19, wherein the peak detect block further includes a clocked device for receiving the difference signal as a data signal and the signal from the peak detection circuit and comparator as a clock signal.

* * * * *